US010754233B2

(12) United States Patent
Iinuma

(10) Patent No.: US 10,754,233 B2
(45) Date of Patent: Aug. 25, 2020

(54) ELECTRONIC DEVICE AND PROJECTION APPARATUS

(71) Applicant: SEIKO EPSON CORPORATION, Tokyo (JP)

(72) Inventor: Kazuyuki Iinuma, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/520,802

(22) Filed: Jul. 24, 2019

(65) Prior Publication Data

US 2020/0033706 A1   Jan. 30, 2020

(30) Foreign Application Priority Data

Jul. 25, 2018  (JP) ................................ 2018-139102

(51) Int. Cl.
| | |
|---|---|
| *G03B 21/16* | (2006.01) |
| *G03B 21/14* | (2006.01) |
| *H04N 9/31* | (2006.01) |
| *H05K 7/20* | (2006.01) |

(52) U.S. Cl.
CPC ........... *G03B 21/16* (2013.01); *G03B 21/145* (2013.01); *H04N 9/3141* (2013.01); *H05K 7/20145* (2013.01); *H05K 7/20181* (2013.01)

(58) Field of Classification Search
CPC .... G03B 21/006; G03B 21/008; G03B 21/16; G03B 21/18; G03B 21/22; G03B 21/28; G03B 21/145; G03B 21/2066; H04N 9/315; H04N 9/3141; H04N 9/3144; H04N 9/3197; H05K 7/20; H05K 7/20145; H05K 7/20181; H05K 7/20209
See application file for complete search history.

(56) References Cited

U.S. PATENT DOCUMENTS

| | | | |
|---|---|---|---|
| 6,352,358 B1 | 3/2002 | Lieberman et al. | |
| 9,316,895 B2 | 4/2016 | Kubo | |
| 2011/0176117 A1* | 7/2011 | Kondo ................. | H04N 9/3144 353/61 |

(Continued)

FOREIGN PATENT DOCUMENTS

| | | |
|---|---|---|
| JP | 2001-209125 A | 8/2001 |
| JP | 2003-156795 A | 5/2003 |

(Continued)

*Primary Examiner* — Sultan Chowdhury
(74) *Attorney, Agent, or Firm* — Dority & Manning, P.A.

(57) ABSTRACT

An electronic device includes an electronic device main body and an accommodation apparatus accommodating the electronic device main body. The accommodation apparatus includes a first enclosure forming an internal space and having a first intake port and a first discharge port, a partitioner partitioning the internal space into a first space and a second space, and a first intake fan sending the air into the first space. The electronic device main body includes a second enclosure having a second intake port and a second discharge port, and a second intake fan sucking air into the electronic device main body. The second intake port is disposed in the first space. The second discharge port is disposed in the second space. The amount of air sent by the first intake fan into the first space is greater than the amount of air sucked by the second intake fan into the second enclosure.

6 Claims, 13 Drawing Sheets

(56) References Cited

U.S. PATENT DOCUMENTS

| | | | |
|---|---|---|---|
| 2011/0176118 A1* | 7/2011 | Wu | ........................ G03B 21/16 |
| | | | 353/61 |
| 2014/0218693 A1 | 8/2014 | Kubo | |
| 2015/0064639 A1 | 3/2015 | Dumbreck | |

FOREIGN PATENT DOCUMENTS

| | | |
|---|---|---|
| JP | 2005-181400 A | 7/2005 |
| JP | 2011-080715 A | 4/2011 |
| JP | 2011-085516 A | 4/2011 |
| JP | 2012-063388 A | 3/2012 |
| JP | 2013-062425 A | 4/2013 |
| JP | 2014-149492 A | 8/2014 |

* cited by examiner

ELECTRONIC DEVICE AND PROJECTION APPARATUS

The present application is based on, and claims priority from JP Application Serial Number 2018-139102, filed Jul. 25, 2018, the disclosure of which is hereby incorporated by reference herein in its entirety.

BACKGROUND

1. Technical Field

The present disclosure relates to an electronic device and a projection apparatus.

2. Related Art

An electronic device installed outdoors has been known. For example, JP-A-2013-62425 proposes a ventilator that prevents entry of rainwater and corresponds to an electronic device installed outdoors. The ventilator is provided with an opening and a fan that cause air to flow through an enclosure of a control panel as the electronic device for ventilation (cooling).

JP-A-2013-62425 is an example of the related art.

The ventilator described in JP-A-2013-62425, however, has a problem of possible insufficient cooling of the control panel (electronic device). In detail, when the ventilation is performed, the air having cooled the interior of the enclosure and hence having been heated mixes with air having been introduced to cool the interior of the enclosure and therefore having a relatively low temperature. The temperature of the cooling air therefore increases, and the electronic device is not sufficiently cooled when operating in a hot environment, such as in summer. That is, an electronic device providing an improved cooling effect as compared with the cooling effect provided in the related art is required.

SUMMARY

An electronic device according to an aspect of the present application is an electronic device including an electronic device main body and an accommodation apparatus that accommodates the electronic device main body. The accommodation apparatus includes a first enclosure that forms an internal space where the electronic device main body is disposed, has a first intake port via which air is taken into the internal space and a first discharge port via which the air is discharged from the internal space, and forms an exterior of the electronic device, a partitioner that partitions the internal space into a first space communicating with the first intake port and a second space communicating with the first discharge port, and a first intake fan that sends the air via the first intake port into the first space. The electronic device main body includes a second enclosure that has a second intake port via which air is taken into the electronic device main body and a second discharge port via which the air inside the electronic device main body is discharged out thereof and forms an exterior of the electronic device main body and a second intake fan that sucks air into the electronic device main body via the second intake port. The second intake port is disposed in the first space, and the second discharge port is disposed in the second space. An amount of air sent by the first intake fan into the first space is greater than an amount of air sucked by the second intake fan into the second enclosure.

In the electronic device described above, the accommodation apparatus may include a shutter disposed between the second space and the first discharge port. The shutter may open and close in accordance with a difference between an air pressure of the second space and an air pressure of an exterior of the first discharge port. The shutter switches between a state in which the second space communicates with the first discharge port and a state in which the second space is isolated from the first discharge port.

In the electronic device described above, the accommodation apparatus may include a filter disposed between the first intake port and the first space.

In the electronic device described above, the filter may be disposed between the first intake port and the first intake fan.

In the electronic device described above, the accommodation apparatus may include an adjustment mechanism that adjusts a position of the electronic device main body accommodated in the accommodation apparatus, and the adjustment mechanism may include a pitching adjustment mechanism and a rolling adjustment mechanism.

A projection apparatus according to another aspect of the present application is a projection apparatus including a projector and an accommodation apparatus that accommodates the projector. The accommodation apparatus includes a first enclosure that forms an internal space where the projector is disposed, has a first intake port via which air is taken into the internal space, a first discharge port via which the air is discharged from the internal space, and a window through which light outputted from the projector passes, and forms an exterior of the projection apparatus, a partitioner that partitions the internal space into a first space communicating with the first intake port and a second space communicating with the first discharge port, and a first intake fan that sends the air via the first intake port into the first space. The projector includes a light source, a light modulator that modulates light emitted from the light source, a projection optical apparatus that projects the light modulated by the light modulator, a second enclosure that has a second intake port via which air is taken into the projector and a second discharge port via which the air inside the projector is discharged out thereof, and forms an exterior of the projector, and a second intake fan that sucks air into the projector via the second intake port. The second intake port is disposed in the first space, and the second discharge port is disposed in the second space. An amount of air sent by the first intake fan into the first space is greater than an amount of air sucked by the second intake fan into the second enclosure.

DESCRIPTION OF EXEMPLARY EMBODIMENTS

An embodiment of the present disclosure will be described below with reference to the drawings. The embodiment described below describes an example of the present disclosure. The present disclosure is not limited to the embodiment described below, and a variety of variations implemented to the extent that the substance of the present disclosure is not changed fall within the scope of the present disclosure. In the following drawings, each member is so drawn at a scale different from an actual scale as to be large enough to be recognizable.

Embodiment

The present embodiment will be described with reference to a projection apparatus which serves as an electronic device and in which a projector as an electronic device body is accommodated in an accommodation apparatus. The projection apparatus can be preferably used, for example, in projection mapping or other applications with the projection apparatus installed outdoors all the time.

Projection Apparatus

Figure 1:
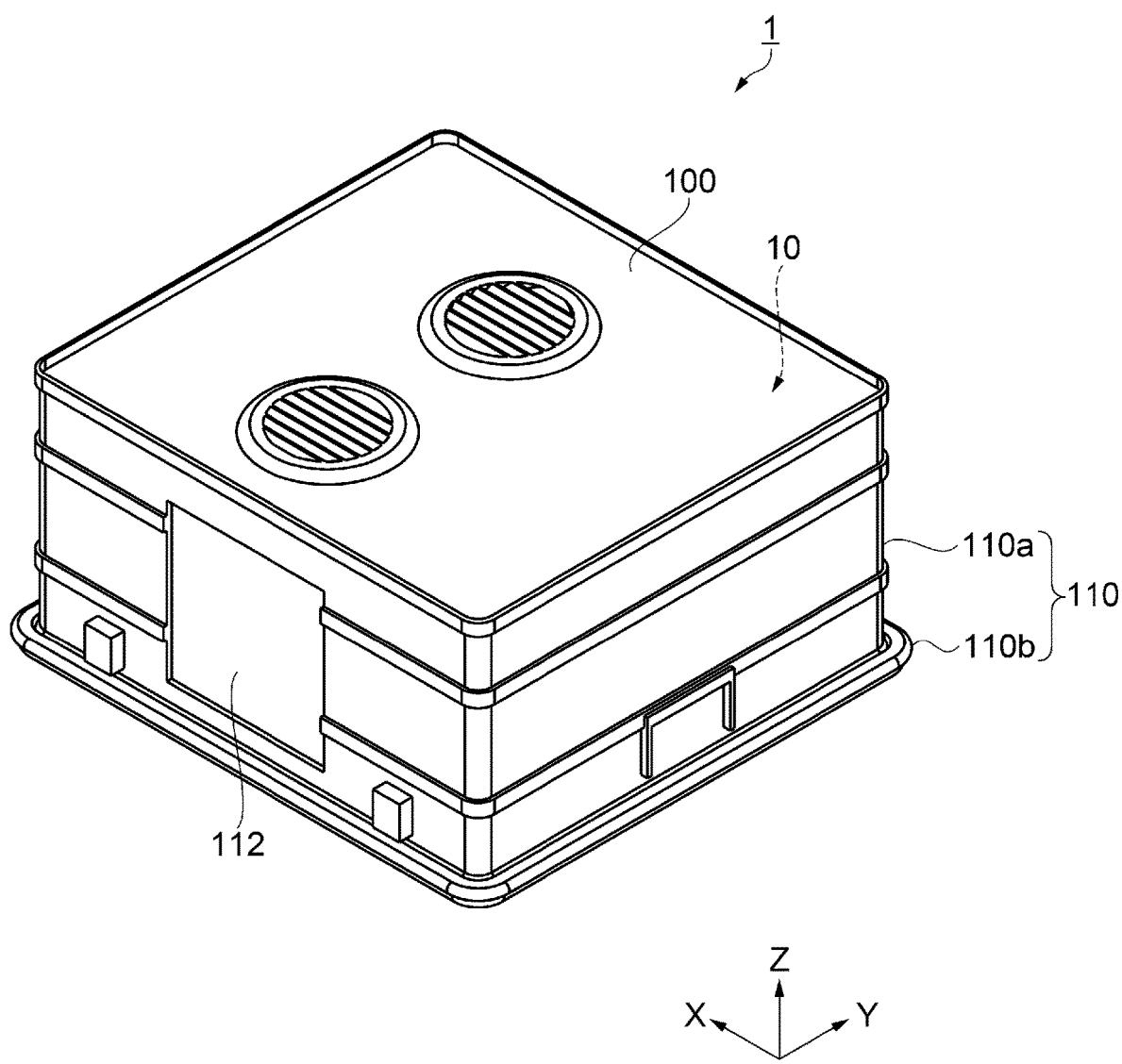
FIG. 1 is a perspective view showing the exterior appearance of a projection apparatus according to an embodiment.
Figure 2:
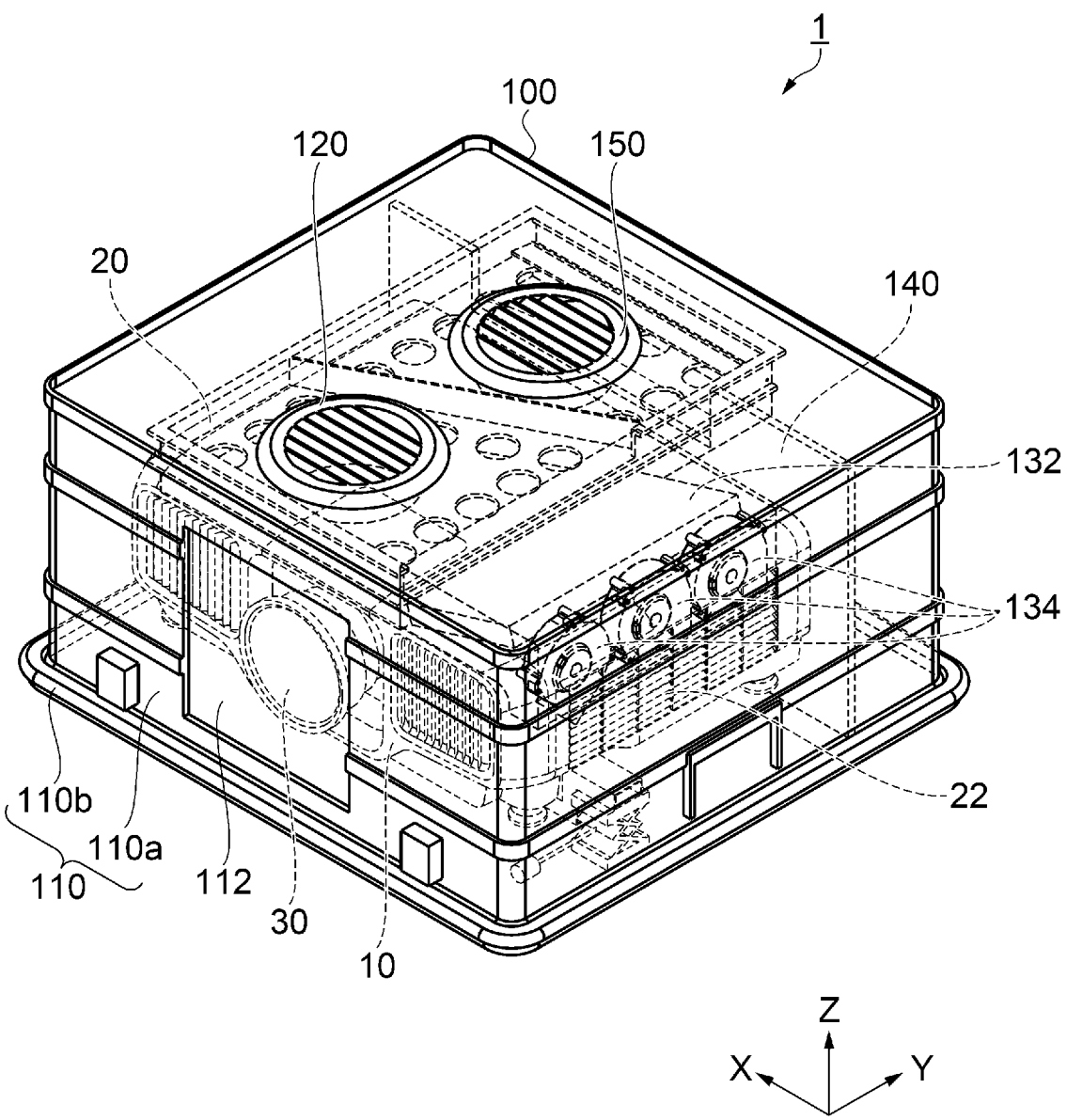
FIG. 2 is a perspective view showing the configuration of the projection apparatus.
Figure 3:
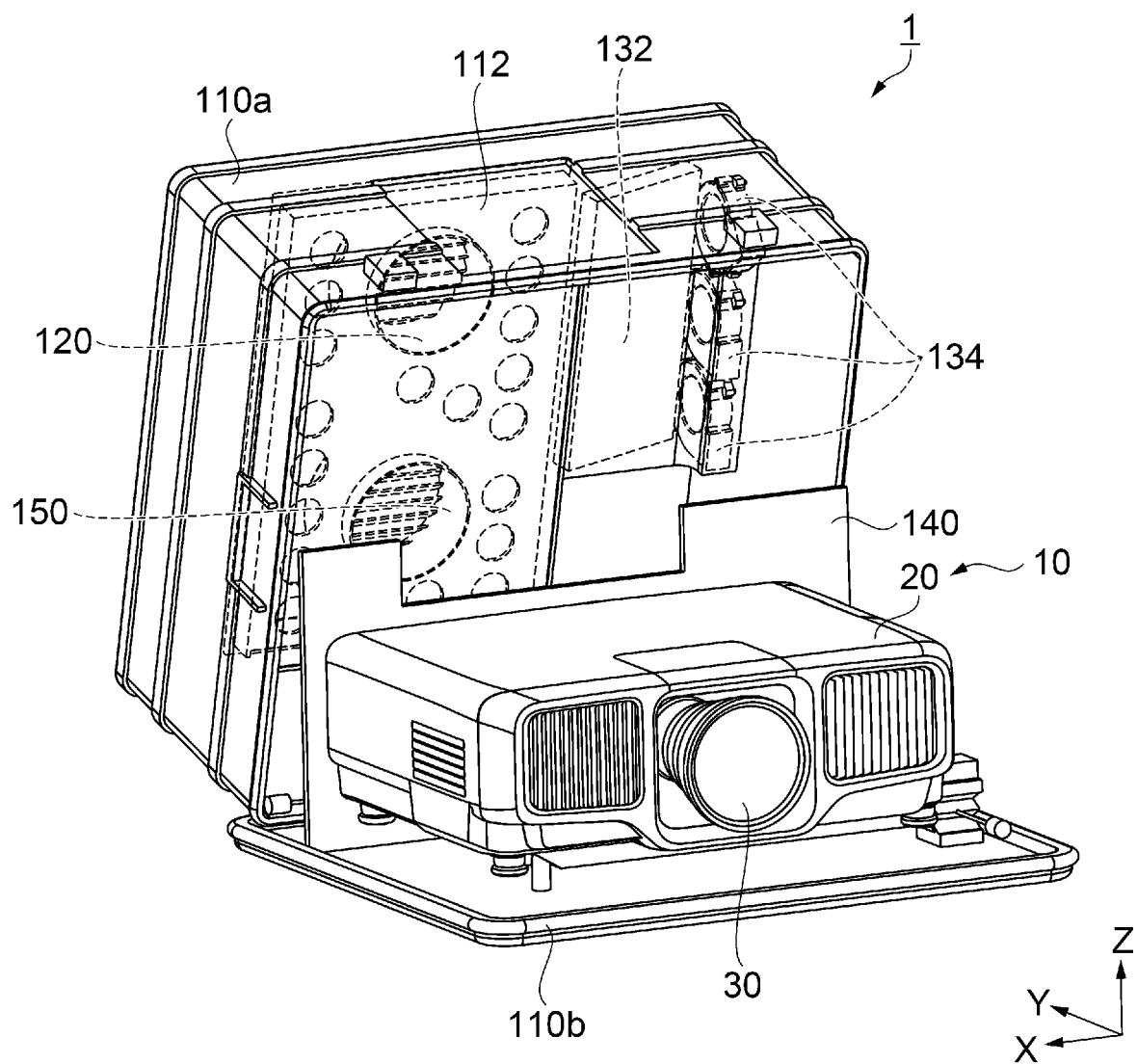
FIG. 3 is a perspective view showing the configuration of the interior of the projection apparatus with an upper enclosure open.

The configuration of the projection apparatus according to the present embodiment will be described with reference to FIGS. 1, 2, and 3. FIG. 1 is a perspective view showing the exterior appearance of the projection apparatus according to the embodiment. FIG. 2 is a perspective view showing the configuration of the projection apparatus. FIG. 3 is a perspective view showing the configuration of the interior of the projection apparatus with an upper enclosure open. In FIG. 2, members in the projection apparatus are drawn with broken lines.

A projection apparatus 1 as the electronic device according to the present embodiment includes a projector 10, which serves as the electronic apparatus main body, and an accommodation apparatus 100, which accommodates the projector 10, as shown in FIG. 1.

The accommodation apparatus 100 includes a first enclosure 110 which forms an exterior of the projection apparatus 1. The projector 10 is disposed in an internal space formed by the first enclosure 110. The first enclosure 110 has a substantially box-like shape and is formed of an upper enclosure 110a and a lower enclosure 110b. The lower enclosure 110b forms the bottom surface of the first enclosure 110, and the upper enclosure 110a forms the four side surfaces and the top surface of the first enclosure 110.

A substantially rectangular window 112 is disposed in a substantially laterally central portion of one of the side surfaces of the upper enclosure 110a. The window 112 transmits light having exited out of a projection lens 30 of a projection optical apparatus, which will be described later, of the projector 10.

It is now assumed that a direction X is the direction along the long sides of a side surface of the upper enclosure 110a that is the side surface where the window 112 is disposed (lateral direction), that a direction Z is the height direction of the first enclosure 110, and that a direction Y is the depth direction of the first enclosure 110 and is perpendicular to the directions X and Z. It is further assumed in the following description that the side on which the upper enclosure 110a is disposed with respect to the lower enclosure 110b is an upper side (positive side in direction Z), and that the negative side in the direction Z is a lower side. It is still further assumed that the right side of the window 112 when viewed from a position in front thereof is a right side (negative side in direction X), that the left side of the window 112 when viewed from a position in front thereof is a left side (positive side in direction X), that the side facing the side surface where the window 112 is disposed is a front side (negative side in direction Y), and that the side facing away from the front side is a rear side (positive side in direction Y).

The accommodation apparatus 100 includes a filter 132, first intake fans 134, and a partitioner 140 as well as the first enclosure 110 (upper enclosure 110a and lower enclosure 110b), as shown in FIG. 2.

The projector 10 is placed in the lower enclosure 110b. The upper enclosure 110a is so attached to the lower enclosure 110b as to cover the upper side of the projector 10. The upper enclosure 110a and the lower enclosure 110b form the internal space of the first enclosure 110, and the projector 10 is disposed in the internal space.

Examples of the material of the upper enclosure 110a and the lower enclosure 110b may include a resin material, a metal material, and other materials, and at least one of these materials can be employed. In a case where a plurality of projection apparatuses 1 are stacked on each other when installed for projection mapping and other applications, in particular, the enclosures may be made of a metal material, which readily provides load capacity.

The outer dimensions of the first enclosure 110 are not limited to specific values and are, for example, as follows: The dimension in the direction X (lateral width) is about 700 mm; the dimension in the direction Y (depth) is about 700 mm; and dimension in the direction Z (height) is about 350 mm.

The first enclosure 110 has the window 112, as described above. The window 112 is so disposed as to face the projection lens 30 of the projector 10. The window 112 is not necessarily made of a specific material and may be made of any translucent material, for example, a resin material and an inorganic glass material. The window 112 is not necessarily so disposed as to face the projection lens 30. The light having exited out of the projection lens 30 only needs to pass through the window 112, and the light having exited out of the projection lens 30 may pass through the window 112, for example, via a reflection mirror.

A first intake port 120 and a first discharge port 150 are provided in a substantially central portion of the upper surface (top surface) of the upper enclosure 110a. The first intake port 120 and the first discharge port 150 are arranged in the order of the first intake port 120 and the first discharge port 150 in the direction from the front side toward the rear side.

The first intake port 120 allows the air to be taken from the outside into the internal space of the first enclosure 110. The first discharge port 150 allows the air to be discharged out of the internal space of the first enclosure 110 to the outside. The first intake port 120 and the first discharge port 150 are each provided with a substantially circular opening that is provided in the first enclosure 110 and a member that has slits and fits into the shape of the opening. In the present specification, the outside refers to an environment where the electronic device is installed, an outdoor or indoor environment.

The filter 132 and the first intake fans 134 are disposed in an upper right portion (upward, rightward portion) of the upper enclosure 110a. The filter 132 has the function of filtering the outside air sucked by the first intake fans 134 via the first intake port 120. The filter 132 therefore captures dust contained in the outside air, and the outside air having a reduced content of dust reaches the first intake fans 134. The filter 132 is not necessarily of a specific type and may, for example, be a dustproof filter made of felt or paper formed of fibers arranged in the form of a plate.

The first intake fans 134 send the air sucked from the outside into the internal space of the first enclosure 110. The first intake fans 134 are not necessarily of a specific type and may, for example, each be a centrifugal fan (what is called sirocco fan). A centrifugal fan is a fan that pushes a gas sucked along the direction of the axis of rotation of the fan out in the centrifugal direction based on centrifugal force produced by the rotation of the fan blades. In the present embodiment, three centrifugal fans are disposed along the direction Y.

The projector 10 includes the projection optical apparatus, which includes the projection lens 30 and will be described later, a second enclosure 20, which forms the exterior of the projector 10, and second intake fans, which will be described later. The second enclosure 20 has a second intake port 22, via which air is taken into the projector 10, and a second discharge port, which will be described later.

The second enclosure 20 has a substantially box-like shape having a short dimension in the height direction. Examples of the material of the second enclosure 20 may include a resin material, a metal material, and other materials, and at least one of these materials can be employed.

The projection lens 30 is disposed in a substantially laterally central portion of the front side surface of the second enclosure 20. The light having exited out of the projection lens 30 passes through the window 112 of the accommodation apparatus 100 and is projected toward the negative side in the direction Y to the outside.

The second intake port 22 is provided in the right side surface of the second enclosure 20. The outside air supplied by the first intake fans 134 in the accommodation apparatus 100 is taken into the projector 10 via the second intake port 22.

FIG. 3 shows the projection apparatus 1 in a state in which the front side of the upper enclosure 110a is opened upward with a rear lower portion of the upper enclosure 110a serving as a pivotal point. The projector 10 is disposed in an internal space of the first enclosure 110, which is formed by the upper enclosure 110a and the lower enclosure 110b, as shown in FIG. 3. The internal space is partitioned by the partitioner 140, which is so disposed as to be substantially parallel to the plane XY, into a first space on the front side and a second space on the rear side. That is, the partitioner 140 partitions the internal space of the first enclosure 110 into the first and second spaces. The partitioner 140 is so disposed as to be shifted toward the rear side of the projector 10. The second intake port 22 (see FIG. 2) of the projector 10 is therefore located in the first space.

The partitioner 140 is a plate-shaped member and is provided with a cutout extending along the internal-space-side shapes of the upper enclosure 110a and the lower enclosure 110b and along the outer shape of the projector 10. Direct air flow between the first and second spaces is therefore restricted. The word "direct" used herein means that indirect air flow via the interior of the projector 10 is excluded. Components made of sponge or any other material may be placed in the gaps between the partitioner 140 and the projector 10, the upper enclosure 110a, and the lower enclosure 110b to seal the gaps described above.

Projector

The present embodiment will be described with reference to a form in which the projector 10 includes an illuminator, a color separation/light guide system, a light modulator, a projection optical apparatus, and other components. The form of the projector 10 is not limited to the form described above.

Figure 4:
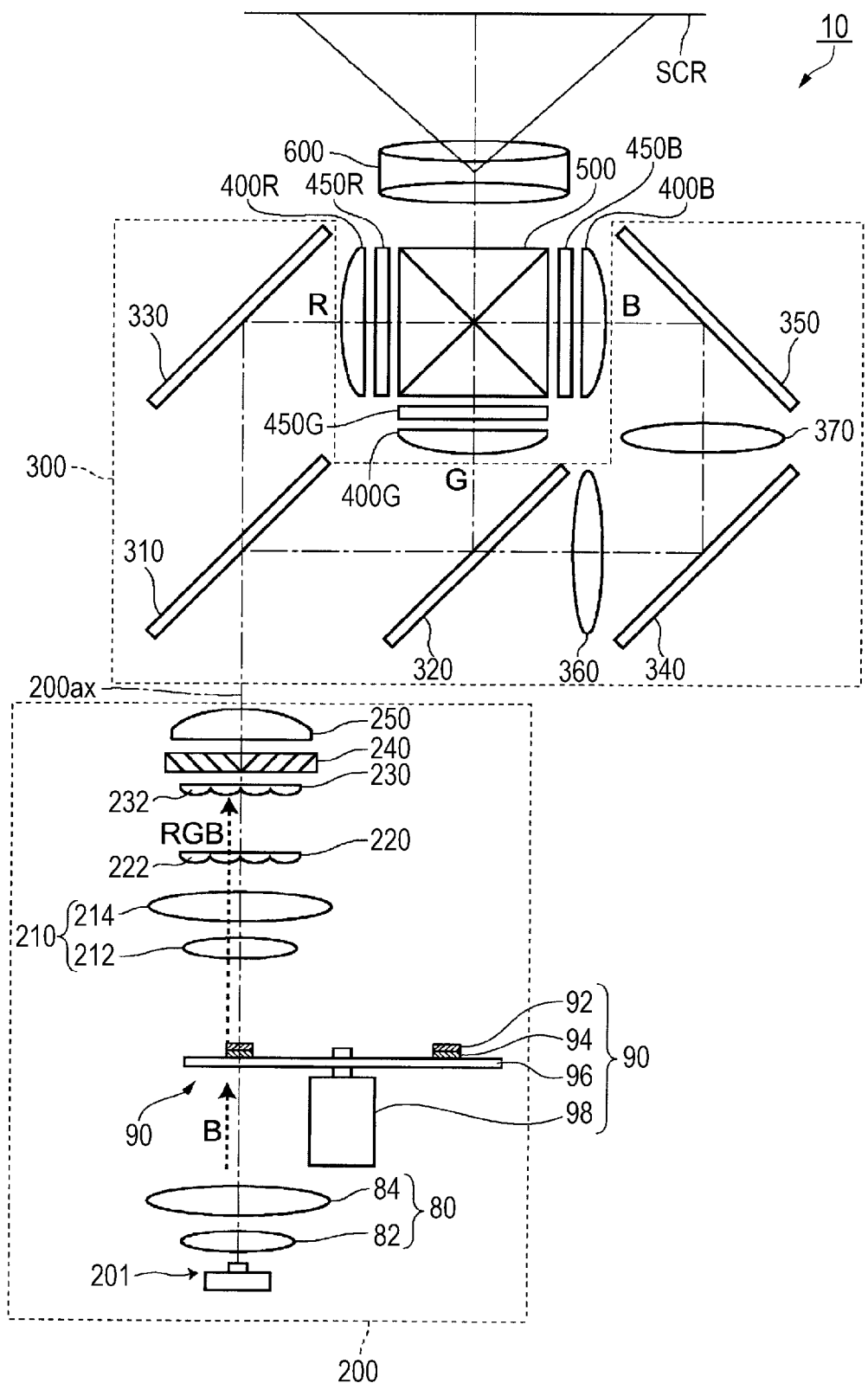
FIG. 4 is a schematic view showing the optical system of a projector.

The optical system of the projector 10 in the present embodiment will be described with reference to FIG. 4. FIG. 4 is a schematic view showing the optical system of the projector 10.

The projector 10 includes an illuminator 200, a color separation/light guide system 300, three liquid light valves 450R, 450G, and 450B as the light modulator (hereinafter also collectively referred to as "light modulators 450"), a cross-dichroic prism 500, and a projection optical apparatus 600, as shown in FIG. 4.

The illuminator 200 includes a light source 201, a light collection system 80, a wavelength converter 90, a collimation system 210, a first lens array 220, a second lens array 230, a polarization converter 240, and a superimposing lens 250.

The light source 201 includes a plurality of light emitting devices (not shown). The light emitting devices may each, for example, be a light emitting diode or a semiconductor laser. The light emitting devices can be so selected as to emit light having an arbitrary wavelength in accordance with the application of the projector 10. For example, a light emitting device that emits blue light having a wavelength ranging from 430 to 490 nm can be made of a material containing a nitride-based semiconductor ($In_xAl_yGa_{1-x-y}N$, $0 \leq x \leq 1$, $0 \leq y \leq 1$, $x+y \leq 1$). Further, in addition to the material described above, the material part of which is replaced with a boron atom as a group-III element or the material in which part of the nitrogen atom as a group-V atom is replaced with a phosphorous atom or an arsenide atom can be used. The light source 201 is not limited to a light emitting device and may, for example, be a white-light light source, such as an ultrahigh-pressure mercury lamp and a halogen lamp, with the configuration of the optical system described below changed.

The light source 201 emits, for example, blue light B toward the light collection system 80. The light collection system 80 includes a first lens 82 and a second lens 84. The light collection system 80 is disposed in the optical path from the light source 201 to the wavelength converter 90 and causes the blue light B substantially collected as a whole to enter a wavelength conversion layer 92, which will be described later. The first lens 82 and the second lens 84 are each formed of a convex lens.

The wavelength converter 90 is what is called a transmissive wavelength converter and is formed of a single wavelength conversion layer 92 continuously formed on part of a disc 96, which is rotatable by a motor 98, along the circumferential direction of the disc 96. The wavelength converter 90 converts the blue light B into fluorescence containing red light R and green light G and outputs the fluorescence toward the side opposite the side on which the blue light B is incident.

The disc 96 is made of a material that transmits the blue light B. The material of the disc 96 can, for example, be quartz glass, crystal quartz, sapphire, optical glass, and transparent resin.

The blue light B from the light source 201 enters the wavelength converter 90 from the side facing the disc 96. The wavelength conversion layer 92 is formed on the disc 96 via a dichroic film 94, which transmits the blue light B and reflects the red light R and the green light G. The dichroic film 94 is formed, for example, of a dielectric multilayer film.

The wavelength conversion layer 92 converts part of the blue light B having a wavelength of about 445 nm from the light source 201 into the fluorescence and emits the fluorescence, and does not convert but transmits the remainder of the blue light B. The light source 201, which emits the excitation light, and the wavelength conversion layer 92 can thus be used to produce desired color light. The wavelength conversion layer 92 is a layer containing, for example, $(Y, Gd)_3(Al, Ga)_5O_{12}$: Ce, which is a YAG-based phosphor, and an organic binder.

The collimation system 210 includes a first lens 212 and a second lens 214, which are each formed of a convex lens, and substantially parallelizes the light from the wavelength converter 90.

The first lens array 220 includes a plurality of first lenslets 222 for dividing the light from the collimation system 210 into a plurality of sub-light fluxes. The plurality of first lenslets 222 provided in the first lens array 220 are arranged in a matrix in a plane perpendicular to an illumination optical axis 200ax.

The second lens array 230 includes a plurality of second lenslets 232 arranged in a matrix in a plane perpendicular to the illumination optical axis 200ax. The plurality of second lenslets 232 are provided in correspondence with the plurality of first lenslets 222 of the first lens array 220. The second lens array 230 has the function of forming, along with the superimposing lens 250, images of the first lenslets 222 of the first lens array 220 in the vicinity of image formation areas of the liquid crystal light valves 450R, 450G, and 450B.

The polarization converter 240 is a polarization converter that aligns the polarization directions of the divided sub-light fluxes from the first lens array 220 with one another into a single polarization direction and outputs the sub-light fluxes as substantially one type of linearly polarized light. The polarization converter 240 includes polarization separation layers, reflection layers, and retardation plates. The polarization separation layers, which each receive the polarized light components contained in the light from the wavelength converter 90, directly transmits one linearly polarized light component and reflects another linearly polarized light component in the direction perpendicular to the illumination optical axis 200ax. The reflection layers each reflect the other linearly polarized light component reflected off the polarization separation layers in the direction parallel to the illumination optical axis 200ax. The retardation plates convert the other linearly polarized light component reflected off the reflection layers into the one linearly polarized light component.

The superimposing lens 250 collects the sub-light fluxes from the polarization converter 240 and superimposes the collected sub-light fluxes on one another in the vicinity of the image formation areas of the liquid crystal light valves 450R, 450G, and 450B.

The first lens array 220, the second lens array 230, and the superimposing lens 250 form an optical integration system that homogenizes the in-plane light intensity distribution of the light from the wavelength converter 90.

The color separation/light guiding system 300 includes dichroic mirrors 310 and 320, reflection mirrors 330, 340, and 350, relay lenses 360 and 370. The color separation/light guiding system 300 has the function of separating the light from the illuminator 200 into the red light R, the green light G, and blue light B and guiding the red light R, the green light G, and blue light B to the liquid crystal light valves 450R, 450G, and 450B, respectively, which are targets to be illuminated.

Field lenses 400R, 400G, and 400B are disposed between the color separation/light guiding system 300 and the liquid crystal light valves 450R, 450G, 450B, respectively.

The dichroic mirror 310 transmits a light component formed of the red light R and reflects a light component formed of the green light G and a light component formed of the blue light B toward the dichroic mirror 320. The dichroic mirror 320 reflects the light component formed of the green light G toward the field lens 400G and transmits the light component formed of the blue light B.

The red light R having passed through the dichroic mirror 310 is reflected off the reflection mirror 330, passes through the field lens 400R, and impinges on the image formation area of the liquid crystal light valve 450R for the red light R.

The green light G reflected off the dichroic mirror 310 is further reflected off the dichroic mirror 320, passes through the field lens 400G, and impinges on the image formation area of the liquid crystal light valve 450G for the green light G.

The blue light B having passed through the dichroic mirror 320 travels via the relay lens 360, the light-incident-side reflection mirror 340, the relay lens 370, the light-exiting-side reflection mirror 350, and the field lens 400B and impinges on the image formation area of the liquid crystal light valve 450B for the blue light B.

The liquid crystal light valves 450R, 450G, and 450B modulate the light emitted from the light source 201. The liquid crystal light valves each modulate the color light incident thereon in accordance with image information to form a color image and are targets to be illuminated by the illuminator 200.

Although not shown, a light-incident-side polarizer and a light-exiting-side polarizer are provided on the light incident side and the light exiting side of the liquid crystal light valve 450R, respectively. The same holds true for the liquid crystal light valves 450G and 450B.

The cross dichroic prism 500 combines the image light outputted from the liquid crystal light valve 450R, the image light outputted from the liquid crystal light valve 450G, and the image light outputted from the liquid crystal light valve 450B with one another to form a color image. The cross dichroic prism 500 is formed by bonding four right-angle prisms and thus has a box-like shape, and dielectric multilayer films are formed on the roughly X-letter-shaped interfaces between the bonded right-angle prisms.

The projection optical apparatus 600 includes the projection lens 30 (see FIG. 2). The projection optical apparatus 600 projects the color image formed by the liquid crystal light valves 450R, 450G, and 450B on a screen SCR via the window 112 (see FIG. 1).

In the illuminator 200 in the present embodiment, the wavelength converter 90 is provided, but the wavelength converter 90 may not be provided. In this case, the light source 201 is used as at least one of a light source that emits the red light R, a light source that emits the green light G, and a light source that emits the blue light B as the light source of the projector.

The projector 10 in the present embodiment has been described with reference to the case where the transmissive liquid crystal light valves are used as the light modulator, but not necessarily. For example, reflective liquid crystal light valves or digital micromirror devices may be used as another example of the light modulator. Further, the number of liquid crystal light valves to be used is not limited to three. The term "transmissive" used herein means that a liquid crystal light valve including a liquid crystal panel or any other component transmits light. The term "reflective" means that the liquid crystal light valve reflects light.

Figure 5:
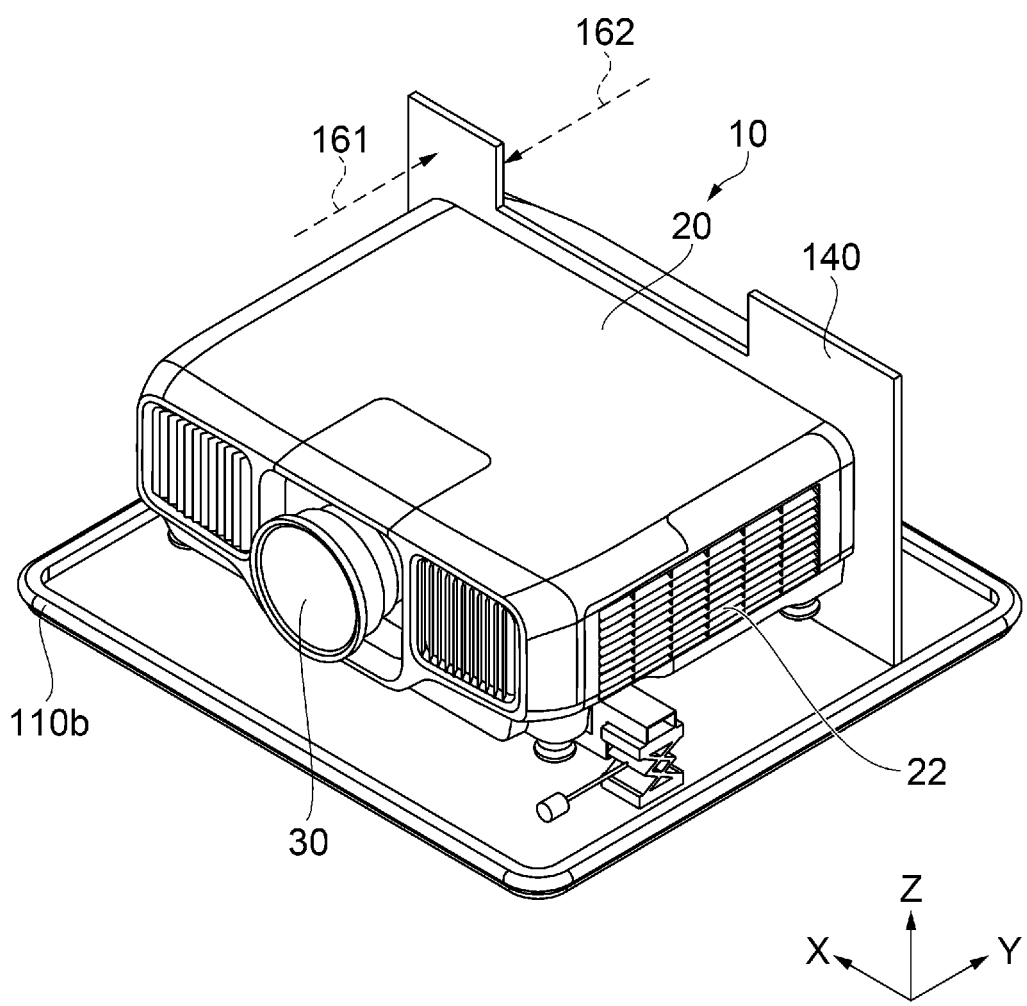
FIG. 5 is a perspective view showing the exterior appearance of the projector disposed in an accommodation apparatus.
Figure 6:
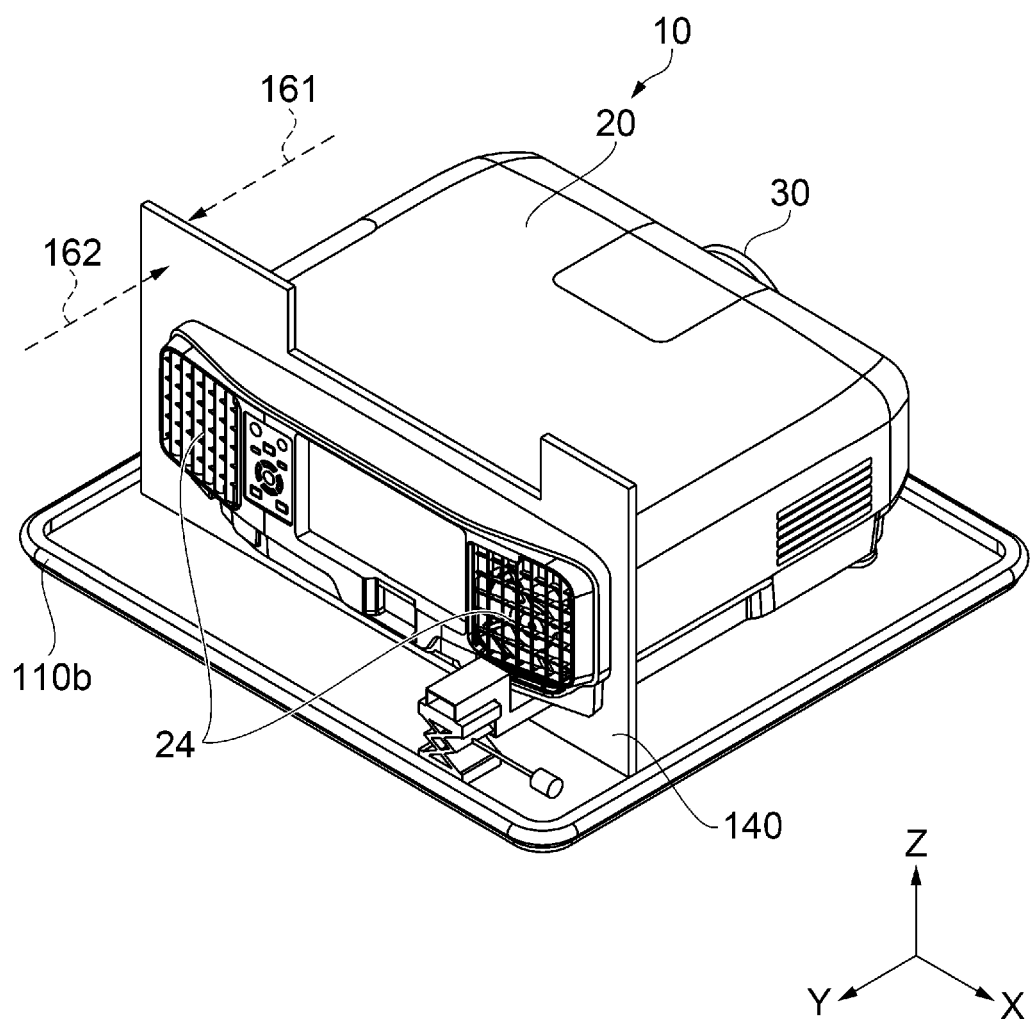
FIG. 6 is a perspective view showing the exterior appearance of the projector disposed in the accommodation apparatus.
Figure 7:
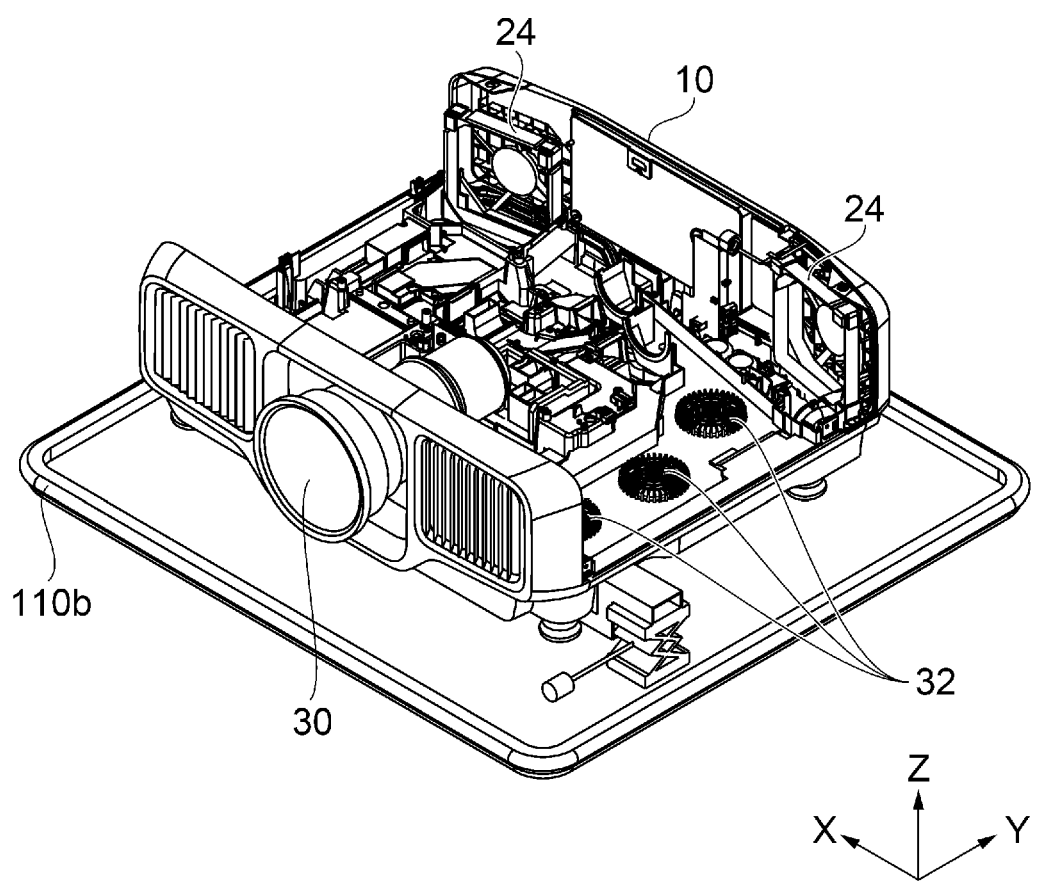
FIG. 7 is a perspective view showing the internal structure of the projector.

The structure of the projector 10 according to the present embodiment will next be described with reference to FIGS. 5, 6, and 7. FIGS. 5 and 6 are perspective views showing the exterior appearance of the projector 10 disposed in the accommodation apparatus 100. FIG. 7 is a perspective view showing the internal structure of the projector 10. FIGS. 5 and 6 show the state in which the upper enclosure 110a of the accommodation apparatus 100 is removed. In FIG. 6, a variety of types of wiring connected to the rear side surface (rear surface) of the projector 10 are omitted. Further, FIG. 7 shows the state in which part of the second enclosure 20 and the entirety of the partitioner 140 and the light source 201 are removed from the state shown in FIG. 5, and some of the other parts built in the projector 10 are also removed.

The partitioner 140 partitions the internal space of the first enclosure 110 into a first space 161 and a second space 162, as shown in FIG. 5. The first space 161 communicates with the first intake port 120 (see FIG. 2) of the first enclosure 110 of the accommodation apparatus 100. The second space 162 communicates with the first discharge port 150 (see FIG. 2) of the first enclosure 110 of the accommodation apparatus 100. The partitioner 140 is so disposed as to be shifted toward the rear side of the projector 10, as described above.

The second intake port 22 is provided in the right side surface of the projector 10, as described above. The second intake port 22 is shifted frontward (negative side in direction Y) from the partitioner 140 and located in the first space 161. The second intake port 22 is formed of slits provided in the second enclosure 20 and allows the air supplied from the first intake fans 134 in the accommodation apparatus 100 to be taken into the projector 10. The second intake port 22 is not necessarily disposed in a side surface of the projector 10. Further, an intake port other than the second intake port 22 may be disposed on a side of the second enclosure 20 that is the side facing the first space 161.

Two second discharge ports 24 are provided in the rear side surface (rear surface) of the second enclosure 20, as shown in FIG. 6. The second discharge ports 24 are disposed in the rear surface of the second enclosure 20 and in the vicinity of the opposite ends of the rear surface in the lateral direction (direction X). The two second discharge ports 24 are shifted rearward (positive side in direction Y) from the partitioner 140 and located in the second space 162.

The second discharge ports 24 are each formed of slits provided in the second enclosure 20 and provided in a substantially rectangular area. The second discharge ports 24 each have the function of discharging the air in the projector 10 out of the projector 10, that is, into the second space 162.

The projector 10 includes second intake fans 32 as well as the projection lens 30 described above and other components, as shown in FIG. 7.

The second intake fans 32 are formed of three fans disposed in the vicinity of the right side surface of the second enclosure 20, that is, the second intake port 22 (see FIG. 2). The second intake fans 32 each take the air from the first space 161 (see FIG. 5) via the second intake port 22 into the projector 10. The second intake fans 32 are not necessarily of a specific type and may, for example, each be the centrifugal fan described above.

In a case where the projector 10 is used in a wide-range, high-luminance projection application, such as projection mapping, the light source 201 and the light modulators 450 tend to be heated. Since the projection apparatus 1 according to the present embodiment has more improved cooling capability than in the related art, overheating of the light source 201 and the light modulators 450 can be suppressed in the above-described application.

The air sucked by the second intake fans 32 via the second intake port 22 cools the light source 201, the light modulators 450 and other parts built in the projector 10 and is then discharged via the second discharge ports 24 into the second space 162 (see FIG. 5). In this process, the temperature of the air discharged via the second discharge ports 24 is higher than the temperature of the outside air because the discharged air has cooled the light source 201, the light modulators 450, and the other parts.

Air Path

Figure 8:
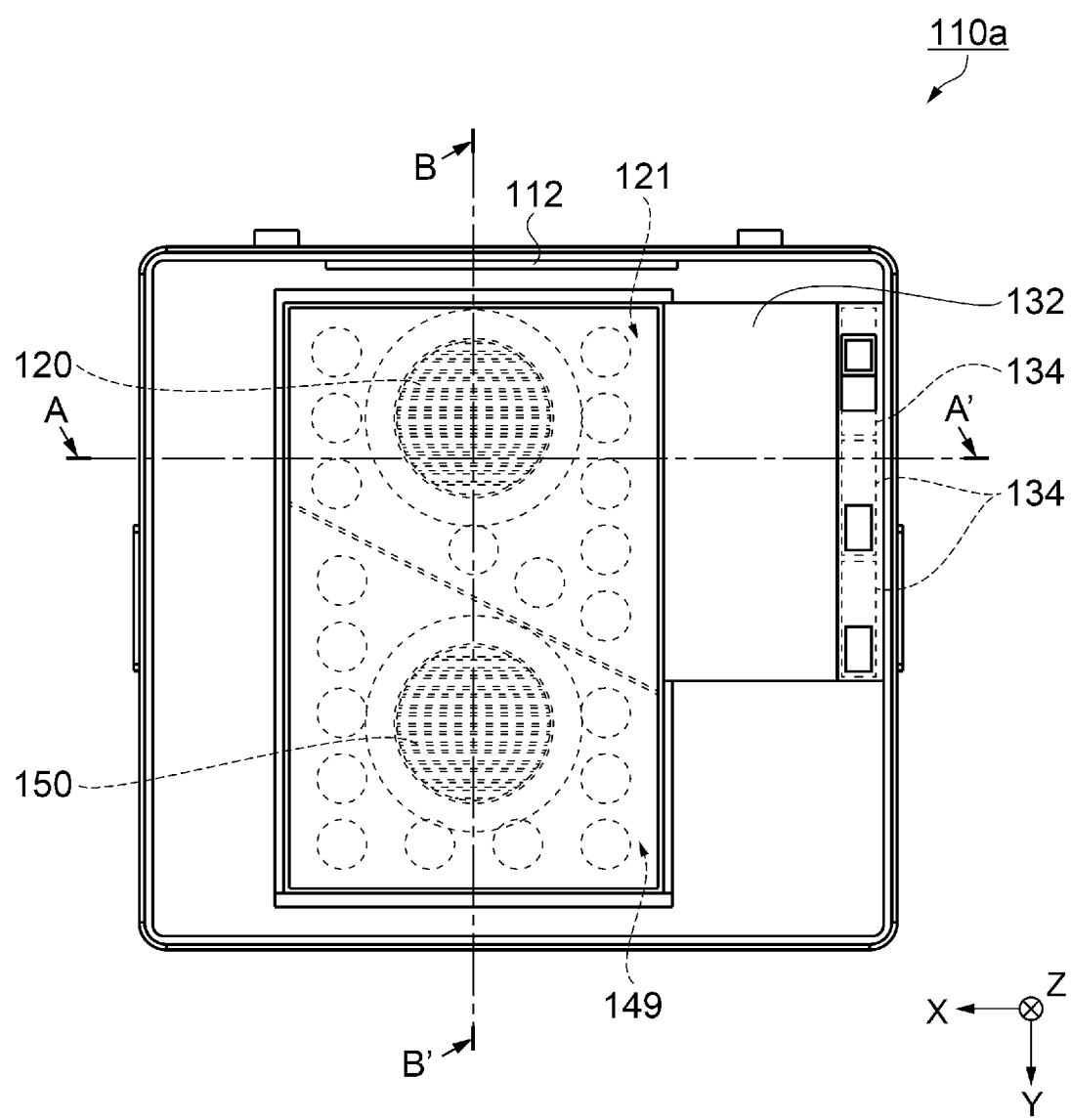
FIG. 8 is a plan view showing the internal structure of the upper enclosure.
Figure 9:
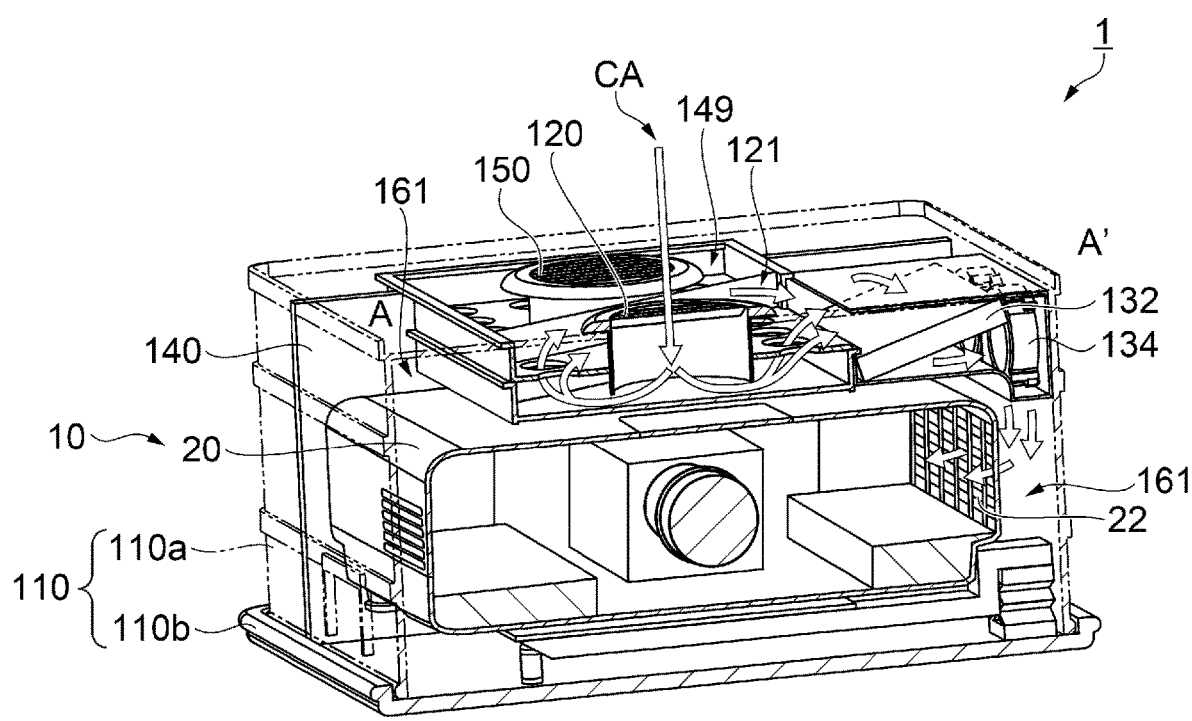
FIG. 9 is a diagrammatic cross-sectional view of the projection apparatus taken along the line A-A' in FIG. 8.
Figure 9:
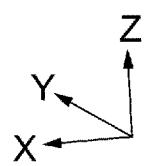
Figure 10:
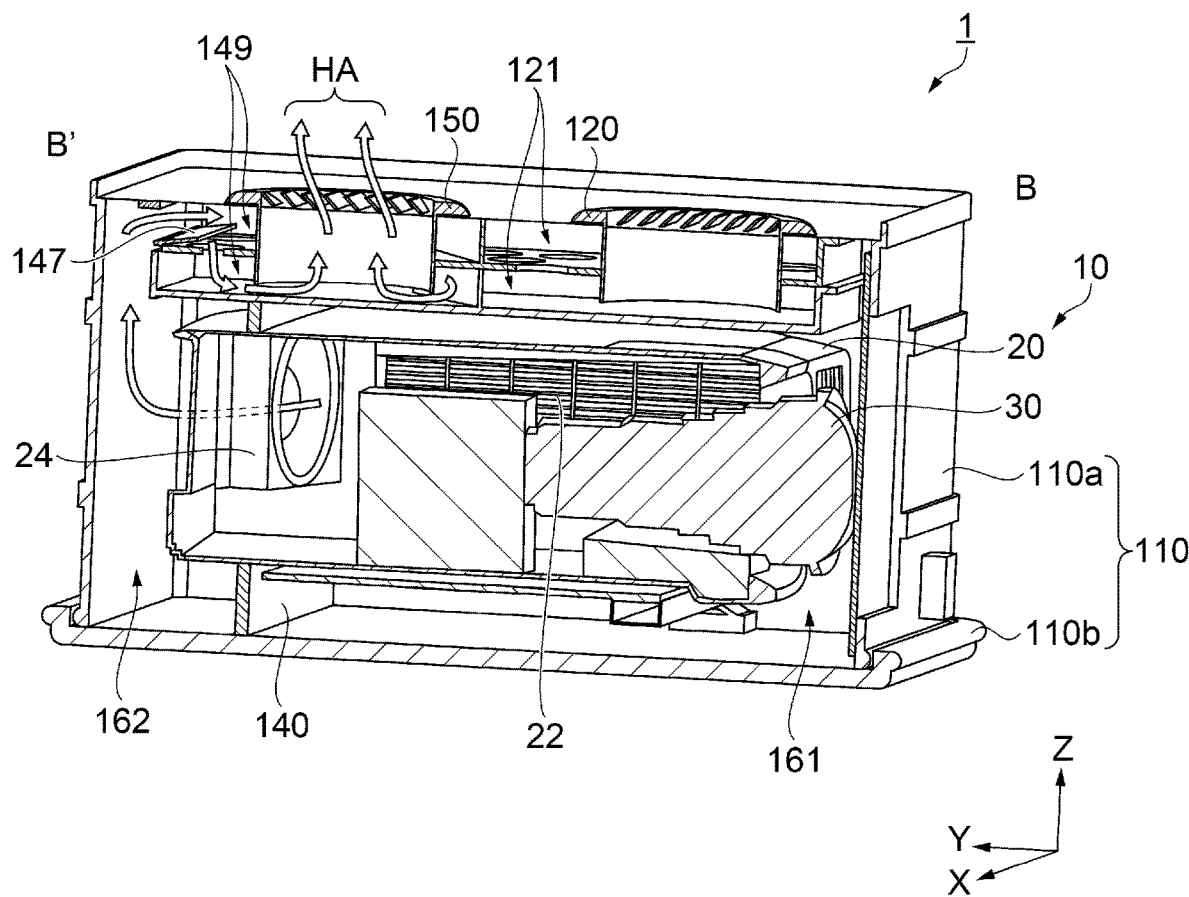
FIG. 10 is a diagrammatic cross-sectional view of the projection apparatus taken along the line B-B' in FIG. 8.

The path of the air in the projection apparatus 1 will be described with reference to FIGS. 8, 9, and 10. FIG. 8 is a plan view showing the internal structure of the upper enclosure. FIG. 9 is a diagrammatic cross-sectional view of the projection apparatus taken along the line A-A' in FIG. 8. FIG. 10 is a diagrammatic cross-sectional view of the projection apparatus taken along the line B-B' in FIG. 8. FIG. 8 shows the state in which the upper enclosure 110a is viewed from the lower side (negative side in direction Z). The line A-A' is a line segment that crosses the first intake port 120, the filter 132, and other components. The line B-B' is a line segment that crosses the first intake port 120, the first discharge port 150, and other components.

The upper enclosure 110a includes a front chamber 121 and a rear chamber 149, as shown in FIG. 8. The front chamber 121 is provided between the first intake port 120 and the filter 132/the first intake fans 134. The filter 132 is disposed between the first intake port 120 and the first intake fans 134. The air taken via the first intake port 120 moves in the upper enclosure 110a via the front chamber 121, the filter 132, and the first intake fans 134 in the presented order. The air taken by the first intake fans 134 via the first intake port 120 is then sent into the first space 161 (see FIG. 5).

The filter 132 may be disposed between the first intake port 120 and the first space 161 (see FIG. 5) or between the first intake fans 134 and the first space 161. It is, however, noted that the first intake fans 134 are readily maintained clean when the filter 132 is disposed on the upstream side of the first intake fans 134 (side facing first intake port 120).

The rear chamber 149 is provided between the second space 162 (see FIG. 6) and the first discharge port 150. The air discharged via the second discharge ports 24 (see FIG. 6) of the projector 10 into the second space 162 is discharged from the second space 162 via the rear chamber 149 out of the first discharge port 150 to the outside. The front chamber 121 and the rear chamber 149 are separate from each other in the upper enclosure 110a and do not communicate with each other.

The amount of air sent by the first intake fans 134 into the first space 161 is greater than the amount of air sucked by the second intake fans 32 (see FIG. 7) into the second enclosure 20. The amount of air used herein is, in the case of the first intake fans 134, the flow rate of the air sent by the fans, and in the case of the second intake fans 32, the flow rate of the air sucked by the fans. The unit of the flow rate is the volume of the air per time, for example, $m^3/h$ (cubic meter/time).

In the present embodiment, the three first intake fans 134 and the three second intake fans 32 are used. In this case, the amount of air described above refers to the total flow rate of the first or second intake fans.

Since the amount of air sent into the first space 161 is greater than the amount of air sucked from the first space 161, the air pressure in the first space 161 is higher than the air pressure in the projector 10. The flow speed of the air passing through the interior of the projector 10 therefore increases. Further, since the pressure in the first space 161 is positive, dust and other foreign matter are unlikely to enter the first space 161, for example, via any gap of the first enclosure 110.

Outside air CA is sucked by the first intake fans 134 and taken into the front chamber 121 via the first intake port 120, as shown in FIG. 9. The front chamber 121 is divided into two portions, an upper portion and a lower portion. The air CA flows along the inner surface of a cylindrical member of the first intake port 120 and travels toward the lower portion of the front chamber 121. The air CA then passes from the lower portion through an opening provided in a partition between the upper portion and the lower portion and reaches the upper portion. The upper portion leads to the filter 132, and the air CA passes through the filter 132 and is sent via the first intake fans 134 into the first space 161.

In this process, dust and other foreign matter contained in the outside air CA are captured by the filter 132, whereby the amount of dust contained in the air CA is reduced. The air CA is then taken from the first space 161 via the second intake port 22 into the projector 10 and cools the light source 201, the light modulators 450, and other parts.

Air HA having cooled the interior of the projector 10 and having therefore been heated is discharged via the second discharge ports 24 into the second space 162, as shown in FIG. 10. A shutter 147 is disposed between the second space 162 and the rear chamber 149. FIG. 10 shows the state in which the shutter 147 is open. The shutter 147 will be described later in detail. When the shutter 147 is opened, the second space 162 communicates with the rear chamber 149, and the air HA travels from the second space 162 into the rear chamber 149.

The rear chamber 149 is divided into two portions, an upper portion and a lower portion. The air HA flows from the second space 162 into the upper portion, then passes through an opening provided in a partition between the upper portion and the lower portion, and reaches the lower portion. A cylindrical member of the first discharge port 150 protrudes into the lower portion. The air HA flows along the inner surface of the cylindrical member and is discharged via the slits of the first discharge port 150 to the outside.

A first discharge fan may be disposed in each of the second discharge ports 24 of the projector 10 on the upstream or downstream side of the flow of the air HA to facilitate the discharge of the air HA into the second space 162. In the case where the first discharge fans are disposed, however, the amount (flow rate) of air HA discharged by the first discharge fans is so set as to be smaller than the amount of air CA sent by the first intake fans 134 into the first space 161.

The first discharge fans are not necessarily of a specific type and may, for example, each be an axial fan. An axial fan is a fan that pushes a gas sucked from one side in the direction of the rotary shaft of the fan out toward the other side based on the rotation of the fan.

FIG. 10 does not show wiring connected to the projector 10, the first intake fans 134 and other components in the accommodation apparatus 100, openings via which the wiring is taken out of the accommodation apparatus 100, or other components.

Shutter

Figure 11A:
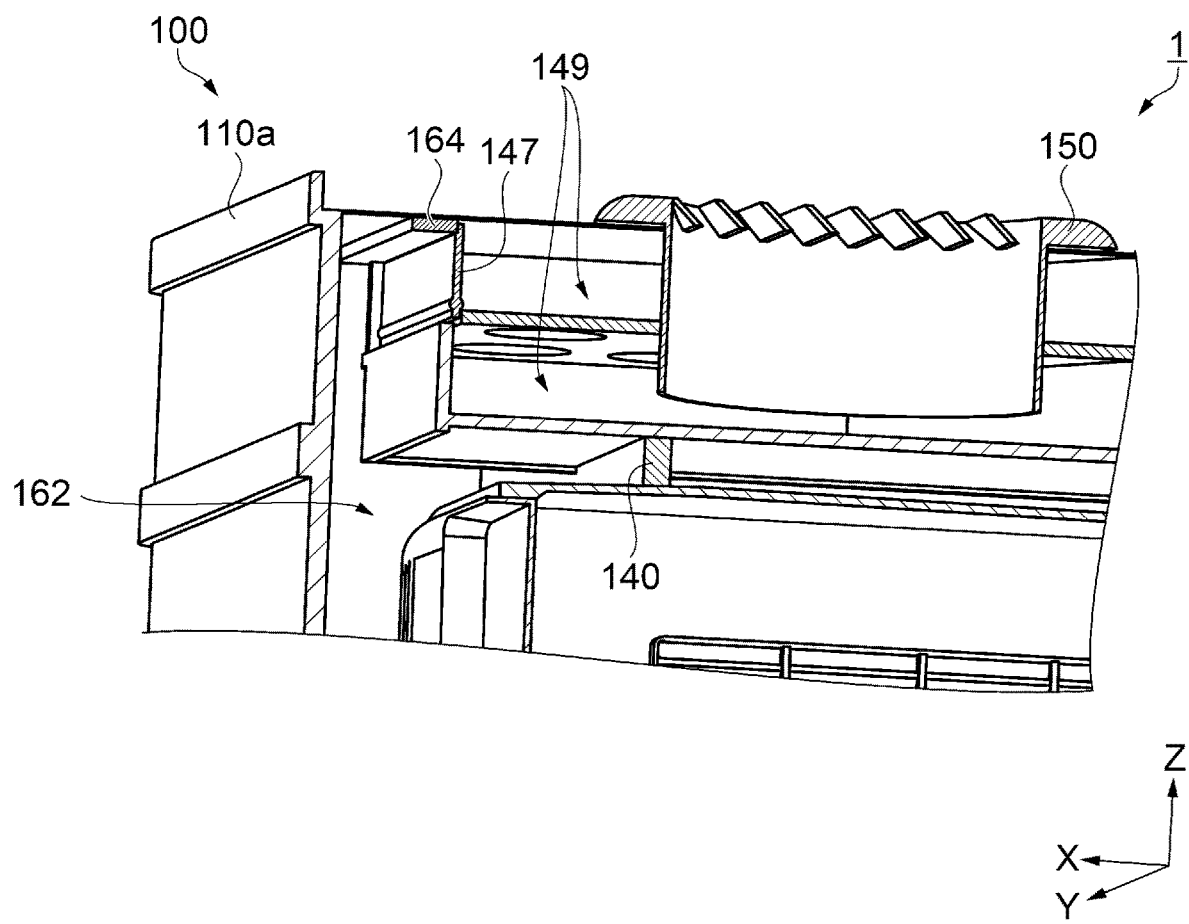
FIG. 11A is an enlarged cross-sectional view of a shutter and an area therearound in the accommodation apparatus taken along a plane XZ.
Figure 11B:
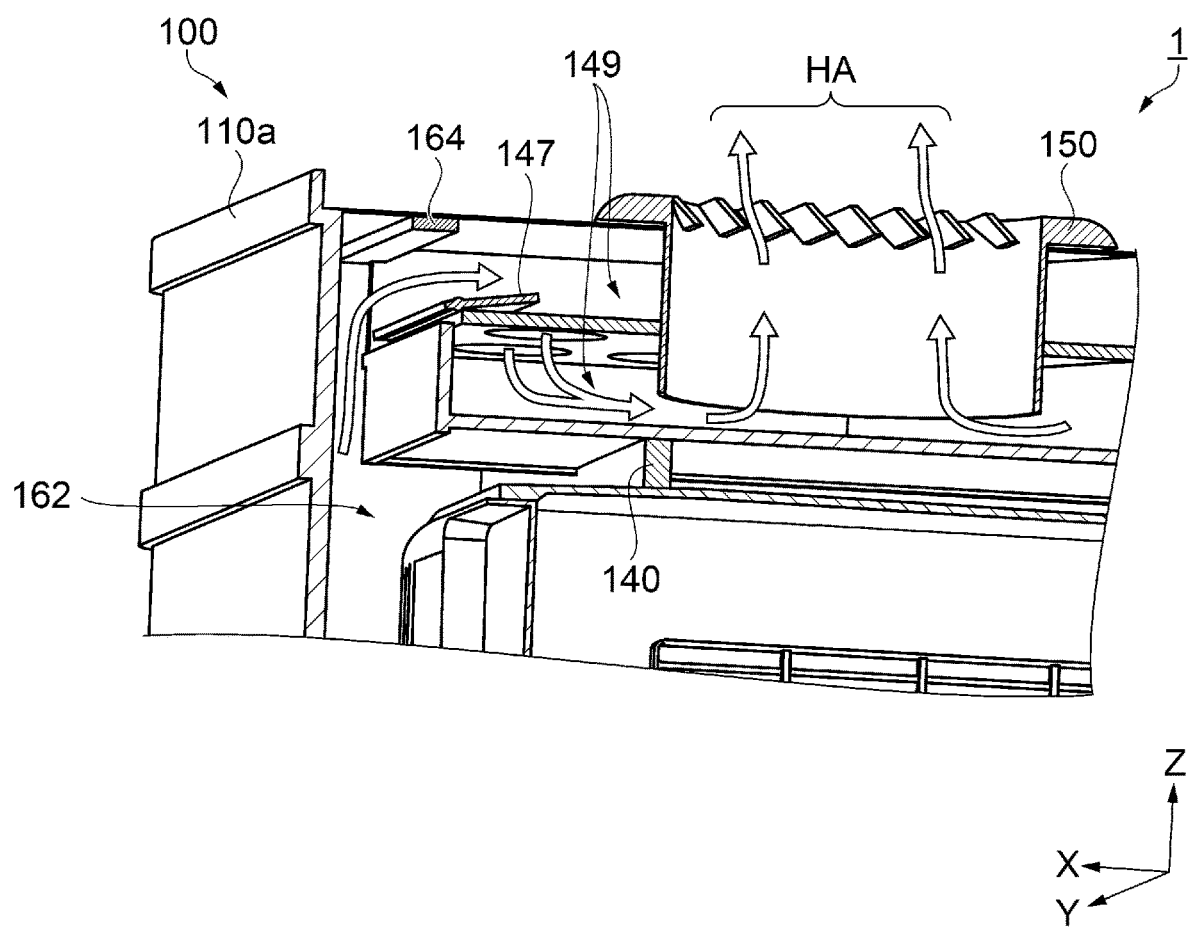
FIG. 11B is an enlarged cross-sectional view of the shutter and the area therearound in the accommodation apparatus taken along the plane XZ.

The configuration and other factors of the shutter 147 between the second space 162 and the rear chamber 149 will be described with reference to FIGS. 11A and 11B. FIGS. 11A and 11B are enlarged cross-sectional views of the shutter and an area therearound in the accommodation apparatus 100 taken along a plane XZ. FIG. 11A shows the state in which the shutter 147 is closed, and FIG. 11B shows the state in which the shutter 147 is open.

The shutter 147 is disposed between the second space 162 and the first discharge port 150 in the accommodation apparatus 100, as shown in FIG. 11A. In other words, the shutter 147 is disposed between the second space 162 and the rear chamber 149. The shutter 147 opens and closes in accordance with the difference in air pressure between the second space 162 and the exterior of the first discharge port 150 (outside) to switch the state in which the second space 162 communicates with the first discharge port 150 to the state in which the second space 162 is isolated from the first discharge port 150 and vice versa.

The shutter 147 is a substantially-rectangular-plate-shaped member and is provided in the partition between the upper and lower portions of the rear chamber 149. The shutter 147 is so urged by a built-in spring member (not shown) as to be in contact with a rib 164, which is provided along the boundary between the second space 162 and the rear chamber 149, to block the path between the second space 162 and the first discharge port 150. A buffer (not shown) is provided in an area of the rib 164 that is the area with which the shutter 147 comes into contact. The intimate contact between the shutter 147 and the rib 164 is thus readily ensured, whereby the airtightness of the blockage between the second space 162 and the first discharge port 150 is improved.

The shutter 147 blocks the path between the second space 162 and the first discharge port 150, for example, when the projection apparatus 1 is stored, transported, or is not in operation. Dust and other foreign matter are therefore unlikely to flow along with the outside air into the second space 162, whereby decrease in the optical characteristics of the optical parts in the projector 10 and degradation of the optical parts due to adhesion of the dust to the optical parts can be avoided.

The shutter 147 opens when the air pressure in the second space 162 is higher than the outside air pressure, and the second space 162 and the rear chamber 149, that is, the second space 162 and the first discharge port 150 communicate with each other, as shown in FIG. 11B. That is, when the first intake fans 134 (see FIG. 2) and the second intake fans 32 (see FIG. 7) of the projection apparatus 1 operate, and the air pressure in the second space 162 becomes higher than the outside air pressure, the shutter 147 opens. The second space 162 therefore communicates with the upper portion of the rear chamber 149, and the air HA is discharged from the second space 162 to the outside via the rear chamber 149 and the first discharge port 150.

The difference in air pressure between the second space 162 and the outside that opens the shutter 147 is not limited to a specific value. The pressure difference described above that opens or closes the shutter 147 can be adjusted, for example, by changing the strength of the spring built in the shutter 147.

Adjustment Mechanism

Figure 12:
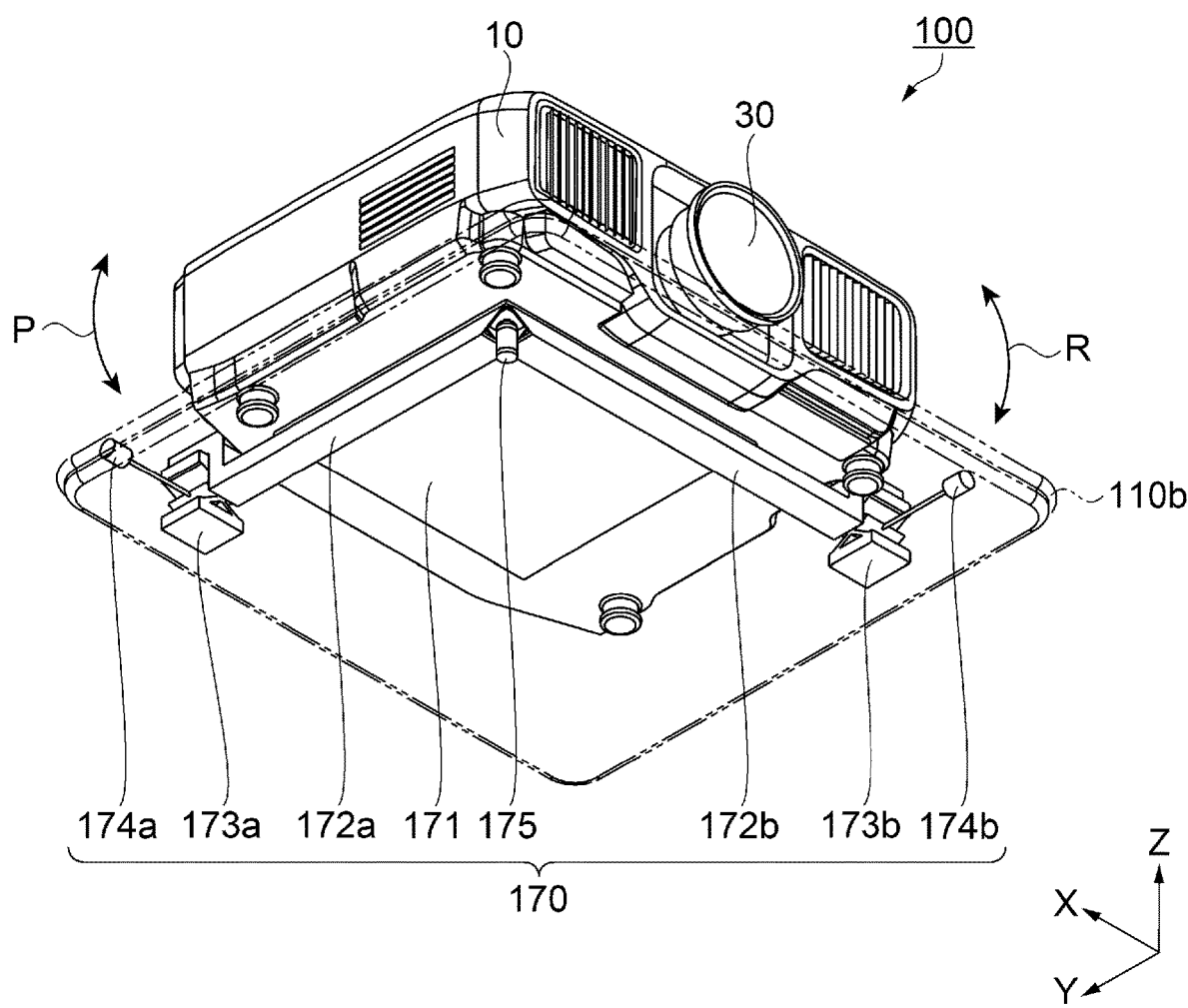
FIG. 12 is a perspective view showing the configuration of an adjustment mechanism.

The configuration of a position adjustment mechanism in the accommodation apparatus 100 will be described with reference to FIG. 12. FIG. 12 is a perspective view showing the configuration of the adjustment mechanism. FIG. 12 shows the lower enclosure 110b and the projector 10 viewed obliquely upward with the lower enclosure 110b drawn with the dotted chain lines.

The accommodation apparatus 100 includes an adjustment mechanism 170, which adjusts the position of the projector 10 accommodated in the accommodation apparatus 100 relative thereto, as shown in FIG. 12. The adjustment mechanism 170 includes a pitching adjustment mechanism 173a and a rolling adjustment mechanism 173b. The adjustment mechanism 170 includes a placement plate 171, support members 172a and 172b, a base member 175, and adjustment knobs 174a and 714b as well as the pitching adjustment mechanism 173a and the rolling adjustment mechanism 173b.

The placement plate 171 is a substantially-oblong-plate-shaped member on which the bottom surface of the projector 10 is placed and which supports the bottom surface. The placement plate 171 is so configured that out of the four sides of the substantially oblong shape, two sides extend in the direction X and the other two sides extend in the direction Y. The support members 172a and 172b are provided below the placement plate 171.

The support member 172a is a rod-shaped member and is so disposed as to substantially overlap with one side of the placement plate 171 that is the left side extending along the direction Y. The length of the support member 172a extending in the direction Y is substantially equal to the length of the projector 10 in the direction Y (depth). The pitching adjustment mechanism 173a is disposed at the rear end (positive side in direction Y) of the support member 172a.

The support member 172b is a rod-shaped member and is so disposed as to substantially overlap with one side of the placement plate 171 that is the front side extending along the direction X. The length of the support member 172b extending in the direction X is substantially equal to the length of the projector 10 in the direction X (width). The rolling adjustment mechanism 173b is disposed at the right end (negative side in direction X) of the support member 172b.

The support member 172a and the support member 172b intersect each other on the front left corner of the placement plate 171. The base member 175 is disposed below the position where the support members 172a and 17b intersect each other. A lower portion of the base member 175 is in contact with the lower enclosure 110b. Further, lower base portions of the pitching adjustment mechanism 173a and the rolling adjustment mechanism 173b are in contact with the lower enclosure 110b. The adjustment mechanism 170, on which the projector 10 is placed, is therefore so placed as to be in contact with the lower enclosure 110b at the following three points: the lower base portion of the pitching adjustment mechanism 173a; the lower base portion of the rolling adjustment mechanism 173b; and the base member 175.

The pitching adjustment mechanism 173a includes a screw jack (not shown) and the adjustment knob 174a. Rotating the adjustment knob 174a allows the screw jack to change the distance (height) between a rear end portion of the support member 172a and the base portion of the pitching adjustment mechanism 173a. That is, changing the distance described above changes the height of the rear end portion of the support member 172a measured from the lower enclosure 110b with the point where the base member 175 and the lower enclosure 110b are in contact with each other serving as the pivotal point. The left rear side of the projector 10 placed on the adjustment mechanism 170 is thus adjusted in terms of position in the upward/downward direction (pitching adjustment P). That is, the pitching adjustment mechanism 173a allows the projector 10 to undergo the pitch adjustment P relative to the accommodation apparatus 100.

The rolling adjustment mechanism 173b includes a screw jack (not shown) and the adjustment knob 174b. Rotating the adjustment knob 174b allows the screw jack to change the distance (height) between a right end portion of the support member 172b and the base portion of the rolling adjustment mechanism 173b. That is, changing the distance described above changes the height of the right end portion of the support member 172b measured from the lower enclosure 110b with the point where the base member 175 and the lower enclosure 110b are in contact with each other serving as the pivotal point. The right front side of the projector 10 placed on the adjustment mechanism 170 is thus adjusted in terms of position in the upward/downward direction (rolling adjustment R). That is, the rolling adjustment mechanism 173b allows the projector 10 to undergo the rolling adjustment R relative to the accommodation apparatus 100.

The adjustment mechanism 170 in the present embodiment includes the pitching adjustment mechanism 173a and the rolling adjustment mechanism 173b, but not necessarily. The adjustment mechanism 170 may instead include one of the pitching adjustment mechanism 173a and the rolling adjustment mechanism 173b. The adjustment mechanism 170 may further include a yawing adjustment mechanism capable of adjusting the direction in which the light exits out of the projection lens 30 in such a way that the exiting direction is changed along the direction X (rightward or leftward).

The upper enclosure 110a of the first enclosure 110 has, although not shown, in correspondence with the adjustment knobs 174a and 174b, openings that allow the adjustment knobs 174a and 174b to be externally operated by an operator outside the first enclosure 110 for the position adjustment described above. The adjustment knobs 174a and 174b can therefore be operated by inserting a screwdriver or any other tool via the openings. Therefore, for example, even in a case where a plurality of projection apparatuses 1 are stacked on each other, the pitching adjustment P and the rolling adjustment R can be performed via the openings. The openings may each be provided with a lid, such as a plug, to ensure airtightness in the accommodation apparatus 100 in a case where the position adjustment is not performed. Entry of dust and other foreign matter via the openings can thus be avoided.

In the present embodiment, the projection apparatus 1 has been presented as the electronic apparatus, and the projector 10 has been presented as the electronic apparatus main body, but the electronic apparatus and the electronic apparatus main body are not limited thereto.

As described above, the projection apparatus 1 according to the present embodiment can provide the following effects.

The effect of cooling the projector 10 accommodated in the accommodation apparatus 100 can be improved. In detail, the internal space where the projector 10 is disposed is partitioned by the partitioner 140 into the first space 161 and the second space 162. The second intake port 22 of the projector 10 is disposed in the first space 161, and the second discharge ports 24 of the projector 10 are disposed in the second space 162. The air CA taken into the projector 10 via the second intake port 22 is therefore unlikely to mix with the air HA discharged from the interior of the projector 10 via the second discharge ports 24. In other words, the air HA having cooled the interior of the projector 10 and having therefore been heated is unlikely to mix with the air CA taken into the projector 10 to cool the interior thereof.

Since the accommodation apparatus 100 includes the first intake fans 134, the air CA is readily taken into the first space 161 via the first intake port 120. That is, the cooling air CA is sufficiently supplied into the projector 10, as compared with a case where no first intake fan 134 is provided.

Since the amount of air CA sent into the first space 161 via the first intake fans 134 is greater than the amount of air CA sucked into the projector 10 via the second intake fans 32, the air pressure in the first space 161 is higher than the air pressure in the projector 10. The flow speed of the air CA passing through the interior of the projector 10 increases, as compared with a case where the air pressure in the first space 161 is lower than or equal to the air pressure in the projector 10.

The interior of the projector 10 can therefore be efficiently cooled. The projection apparatus 1 according to the present embodiment can therefore provide an improved cooling effect as compared with the cooling effect provided in the related art.

The air pressure in the first space 161 is higher than the air pressure in the projector 10 and is further higher than the air pressure outside the projection apparatus 1. That is, the air pressure in the first space 161 is positive with respect to the air pressure outside the projection apparatus 1. The air is therefore unlikely to flow into the first space 161 via a portion other than the first intake port 120, for example, a gap of the accommodation apparatus 100. Dust and other foreign matter outside the projection apparatus 1 are therefore unlikely to enter the first space 161, whereby decrease in the optical characteristics of the optical parts in the projector 10 and degradation of the optical parts due to the dust can be avoided.

Since the shutter 147 blocks the communication between the second space 162 and the first discharge port 150, reverse airflow via the first discharge port 150 into the second space 162 is avoided. Therefore, for example, in a case where the projection apparatus 1 is not in operation, dust and other foreign matter outside the projection apparatus 1 are unlikely to flow along with the air into the projection apparatus 1. Decrease in the optical characteristics of the optical parts in the projector 10 and degradation of the optical parts can therefore be avoided.

Since the accommodation apparatus 100 includes the filter 132, the air CA is taken into the first space 161 via the first intake port 120 and the filter 132. Therefore, even when the air outside the projection apparatus 1 contains dust and other foreign matter, the filter 132 reduces the amount thereof. Decrease in the optical characteristics of the optical parts in the projector 10 and degradation of the optical parts can therefore be avoided. Further, the air CA sucked via the first intake port 120 passes through the filter 132 and then reaches the first intake fans 134. Therefore, even when the air outside the projection apparatus 1 contains dust and other foreign matter, degradation in the performance of the first intake fans 134 due to the dust can be avoided.

The position of the projector 10 can be adjusted via the openings of the upper enclosure 110a. That is, in the state in which the projection apparatus 1 is installed, the pitching adjustment P and the rolling adjustment R can be performed by the operator outside the projection apparatus 1 (first enclosure 110).

Since the first enclosure 110 of the accommodation apparatus 100 includes the window 112, light can be projected via the projection lens 30 of the projector 10 through the window 112 out of the projection apparatus 1.

The contents derived from the embodiment will be described below.

An electronic device includes an electronic device main body and an accommodation apparatus that accommodates the electronic device main body. The accommodation apparatus includes a first enclosure that forms an internal space where the electronic device main body is disposed, has a first intake port via which air is taken into the internal space and a first discharge port via which the air is discharged from the internal space, and forms the exterior of the accommodation apparatus, a partitioner that partitions the internal space into a first space that communicates with the first intake port and a second space that communicates with the first discharge port, and a first intake fan that sends the air via the first intake port into the first space. The electronic device main body includes a second enclosure that has a second intake port via which air is taken into the electronic device main body and a second discharge port via which the air inside the electronic device main body is discharged out thereof and forms the exterior of the electronic device main body and a second intake fan that sucks air into the electronic device main body via the second intake port. The second intake port is disposed in the first space, and the second discharge port is disposed in the second space. The amount of air sent by the first intake fan into the first space is greater than the amount of air sucked by the second intake fan into the second enclosure.

According to the configuration described above, the electronic device main body accommodated in the accommodation apparatus can be cooled in an improved manner. In detail, the internal space where the electronic device main body is disposed is partitioned by the partitioner into the first and second spaces. The second intake port of the electronic device main body is disposed in the first space, and the second discharge port of the electronic device main body is disposed in the second space. The air taken into the electronic device main body via the second intake port is therefore unlikely to mix with the air discharged from the interior of the electronic device main body via the second discharge port. In other words, the air having cooled the interior of the electronic device main body and having therefore been heated is unlikely to mix with the air taken into the electronic device main body to cool the interior thereof.

Since the accommodation apparatus includes the first intake fan, the air is readily taken into the first space via the first intake port. That is, the cooling air is sufficiently supplied into the electronic device main body, as compared with a case where no first intake fan is provided.

Since the amount of air sent into the first space via the first intake fan is greater than the amount of air sucked into the electronic device main body via the second intake fan, the air pressure in the first space is higher than the air pressure in the electronic device main body. The flow speed of the air passing through the interior of the electronic device main body increases, as compared with a case where the air pressure in the first space is lower than or equal to the air pressure in the electronic device main body.

The interior of the electronic device main body can therefore be efficiently cooled. The electronic device according to the present embodiment can therefore provide an improved cooling effect as compared with the cooling effect provided in the related art.

In the electronic device described above, it is preferable that the accommodation apparatus includes a shutter disposed between the second space and the first discharge port, and that the shutter opens and closes in accordance with the difference in air pressure between the second space and the exterior of the first discharge port to switch the state in which the second space communicates with the first discharge port to the state in which the second space is isolated from the first discharge port and vice versa.

According to the configuration described above, since the shutter blocks the communication between the second space and the first discharge port, reverse airflow via the first discharge port into the second space is avoided. Therefore, for example, in a case where the electronic device is not in operation, dust outside the electronic device is unlikely to flow along with the air into the electronic device. Decrease in the characteristics of parts in the electronic device main body and degradation of the parts due to the attachment of the dust in the electronic device main body can therefore be avoided.

In the electronic device described above, it is preferable that the accommodation apparatus includes a filter between the first intake port and the first space.

According to the configuration described above, the air is taken into the first space via the first intake port and the filter. Therefore, even when the air outside the electronic device contains dust, the filter captures the dust, whereby entry of the air containing dust into the first space can be avoided. Decrease in the optical characteristics of optical parts in the electronic device main body and degradation of the optical parts can therefore be avoided.

In the electronic device described above, it is preferable that the filter is disposed between the first intake port and the first intake fan.

According to the configuration described above, the air sucked via the first intake port passes through the filter and then reaches the first intake fan. Therefore, even when the air outside the electronic device contains dust, degradation in the performance of the first intake fans due to the dust can be avoided.

In the electronic device described above, it is preferable that the accommodation apparatus includes an adjustment mechanism that adjusts the position of the electronic device main body accommodated in the accommodation apparatus relative thereto, and that the adjustment mechanism includes a pitching adjustment mechanism and a rolling adjustment mechanism.

According to the configuration described above, in the state in which the electronic device is installed, the pitching adjustment and the rolling adjustment can be performed by the operator outside the electronic device.

A projection apparatus includes a projector and an accommodation apparatus that accommodates the projector. The accommodation apparatus includes a first enclosure that forms an internal space where the projector is disposed, has a first intake port via which air is taken into the internal space, a first discharge port via which the air is discharged from the internal space, and a window through which light outputted from the projector passes, and forms the exterior of the accommodation apparatus, a partitioner that partitions the internal space into a first space that communicates with the first intake port and a second space that communicates with the first discharge port, and a first intake fan that sends the air via the first intake port into the first space. The projector includes a light source, a light modulator that modulates light emitted from the light source, a projection optical apparatus that projects the light modulated by the light modulator, a second enclosure that has a second intake port via which air is taken into the projector and a second discharge port via which the air inside the projector is discharged out thereof and forms the exterior of the projector, and a second intake fan that sucks air into the projector via the second intake port. The second intake port is disposed in the first space, and the second discharge port is disposed in the second space. The amount of air sent by the first intake fan into the first space is greater than the amount of air sucked by the second intake fan into the second enclosure.

According to the configuration described above, the projector accommodated in the accommodation apparatus can be cooled in an improved manner. In detail, the internal space where the projector is disposed is partitioned by the partitioner into the first and second spaces. The second intake port of the projector is disposed in the first space, and the second discharge port of the projector is disposed in the second space. The air taken into the projector via the second intake port is therefore unlikely to mix with the air discharged from the interior of the projector via the second discharge port. In other words, the air having cooled the interior of the projector and having therefore been heated is unlikely to mix with the air taken into the projector to cool the interior thereof.

Since the accommodation apparatus includes the first intake fan, the air is readily taken into the first space via the first intake port. That is, the cooling air is sufficiently supplied into the projector, as compared with a case where no first intake fan is provided.

Since the amount of air sent into the first space via the first intake fan is greater than the amount of air sucked into the projector via the second intake fan, the air pressure in the first space is higher than the air pressure in the projector. The flow speed of the air passing through the interior of the projector increases, as compared with a case where the air pressure in the first space is lower than or equal to the air pressure in the projector.

The interior of the projector can therefore be efficiently cooled. The projection apparatus according to the present embodiment can therefore provide an improved cooling effect as compared with the cooling effect provided in the related art.

The air pressure in the first space is higher than the air pressure in the projector and is further higher than the air pressure outside the projection apparatus. That is, the air pressure in the first space is positive with respect to the air pressure outside the projection apparatus. The air is therefore unlikely to flow into the first space via a portion other than the first intake port, for example, a gap of the accommodation apparatus. Dust outside the projection apparatus is therefore unlikely to enter the first space, whereby decrease in the optical characteristics of optical parts in the projector and degradation of the optical parts due to the dust can be avoided.

Since the first enclosure of the accommodation apparatus includes the window, light can be projected via the projection optical apparatus of the projector through the window out of the projection apparatus.

What is claimed is:

1. An electronic device comprising: an electronic device main body; and an accommodation apparatus that accommodates the electronic device main body, wherein:
the accommodation apparatus includes
a first enclosure that forms an internal space where the electronic device main body is disposed, the first enclosure having a first intake port via which air is taken into the internal space and a first discharge port via which the air is discharged from the internal space, the first enclosure forming an exterior of the electronic device,
a partitioner that partitions the internal space into a first space communicating with the first intake port and a second space communicating with the first discharge port, and
a first intake fan that sends the air via the first intake port into the first space,
the electronic device main body includes
a second enclosure that has a second intake port via which air is taken into the electronic device main body and a second discharge port via which the air inside the electronic device main body is discharged out thereof, the second enclosure forming an exterior of the electronic device main body, and
a second intake fan that sucks air into the electronic device main body via the second intake port,
the second intake port is disposed in the first space,
the second discharge port is disposed in the second space, and
an amount of air sent by the first intake fan into the first space is greater than an amount of air sucked by the second intake fan into the second enclosure.

2. The electronic device according to the claim 1, wherein: the accommodation apparatus includes a shutter disposed between the second space and the first discharge port, the shutter opens and closes in accordance with a difference between an air pressure of the second space and an air pressure of an exterior of the first discharge port, and the shutter switches between a state in which the second space communicates with the first discharge port and a state in which the second space is isolated from the first discharge.

3. The electronic device according to claim 1,
wherein the accommodation apparatus includes a filter disposed between the first intake port and the first space.

4. The electronic device according to claim 3,
wherein the filter is disposed between the first intake port and the first intake fan.

5. The electronic device according to claim 1, wherein:
the accommodation apparatus includes an adjustment mechanism that adjusts a position of the electronic device main body accommodated in the accommodation apparatus, and
the adjustment mechanism includes a pitching adjustment mechanism and a rolling adjustment mechanism.

6. A projection apparatus comprising: a projector; and an accommodation apparatus that accommodates the projector, wherein:
the accommodation apparatus includes
a first enclosure that forms an internal space where the projector is disposed, the first enclosure having a first intake port via which air is taken into the internal space, a first discharge port via which the air is discharged from the internal space and a window through which light outputted from the projector passes, the first enclosure forming an exterior of the projection apparatus,
a partitioner that partitions the internal space into a first space communicating with the first intake port and a second space communicating with the first discharge port, and
a first intake fan that sends the air via the first intake port into the first space,
the projector includes
a light source,
a light modulator that modulates light emitted from the light source,
a projection optical apparatus that projects the light modulated by the light modulator,
a second enclosure that has a second intake port via which air is taken into the projector and a second discharge port via which the air inside the projector is discharged out thereof, the second enclosure forming an exterior of the projector, and
a second intake fan that sucks air into the projector via the second intake port,
the second intake port is disposed in the first space,
the second discharge port is disposed in the second space, and
an amount of air sent by the first intake fan into the first space is greater than an amount of air sucked by the second intake fan into the second enclosure.

* * * * *